United States Patent [19]

Doemens et al.

[11] Patent Number: 4,897,598

[45] Date of Patent: Jan. 30, 1990

[54] APPARATUS FOR ELECTRICAL FUNCTION TESTING OF WIRING MATRICES, PARTICULARLY OF PRINTED CIRCUIT BOARDS

[75] Inventors: Guenter Doemens, Holzkirchen; Thomas Rose, Munich, both of Fed. Rep. of Germany

[73] Assignee: Siemens Aktiengesellschaft, Berlin and Munich, Fed. Rep. of Germany

[21] Appl. No.: 164,856

[22] Filed: Mar. 7, 1988

[30] Foreign Application Priority Data

Mar. 31, 1987 [DE] Fed. Rep. of Germany ....... 3710594

[51] Int. Cl.$^4$ ...................... G01R 31/02; G01R 15/12
[52] U.S. Cl. .................................. 324/158 F; 324/500
[58] Field of Search ........... 324/73 PC, 158 P, 158 F, 324/73 AR, 500; 439/212, 74, 49

[56] References Cited

U.S. PATENT DOCUMENTS

| | | | |
|---|---|---|---|
| 3,806,800 | 4/1974 | Bovc et al. | 324/158 PX |
| 3,963,986 | 6/1976 | Morton et al. | 324/158 PX |
| 4,056,773 | 11/1977 | Sullivan | 324/73 PC X |
| 4,179,170 | 12/1979 | Splitt et al. | 439/49 X |
| 4,352,061 | 9/1982 | Matrone | 324/73 PC X |
| 4,600,878 | 7/1986 | Doemens et al. | 324/514 |
| 4,685,753 | 8/1987 | Isshiki et al. | 439/78 X |
| 4,705,329 | 11/1987 | Doemens | 324/500 X |
| 4,724,377 | 2/1988 | Maelzer et al. | 324/73 PC X |
| 4,724,383 | 2/1988 | Hart | 324/73 PC X |

FOREIGN PATENT DOCUMENTS

| | | |
|---|---|---|
| 0115135 | 5/1983 | European Pat. Off. . |
| 0102565 | 8/1983 | European Pat. Off. . |
| 0216135 | 8/1986 | European Pat. Off. . |
| 0218058 | 9/1986 | European Pat. Off. . |
| 2085673 | 10/1981 | United Kingdom . |

OTHER PUBLICATIONS

Graf; "Radio Shack Dictionary of Electronics"; 1974–1975 p. 76.

Federnde Prufspitzen-wichtiges Zubehor in der Pruftechnik Elektronik Produktion & Pruftechnik, Nov. 1979.

*Primary Examiner*—Reinhard J. Eisenzopf
*Assistant Examiner*—Vinh P. Nguyen
*Attorney, Agent, or Firm*—Hill, Van Santen, Steadman & Simpson

[57] ABSTRACT

Apparatus for electrical function testing of wiring matrices, particularly of printed circuit boards. In the electrical function testing of wiring matrices, particularly of printed circuit boards, the number of required leads and switch elements can be drastically reduced. In the present apparatus, every measuring locations of the printed circuit board can be selected by an associated busbar and by an intermediate mask that prevents the contacting of non-selected measuring locations. The busbars preferably are orientated transversely relative to the principal direction of the wiring of the printed circuit board.

11 Claims, 2 Drawing Sheets

APPARATUS FOR ELECTRICAL FUNCTION TESTING OF WIRING MATRICES, PARTICULARLY OF PRINTED CIRCUIT BOARDS

BACKGROUND OF THE INVENTION

The invention is directed to an apparatus for electrical function testing of wiring matrices, particularly of printed circuit boards. The apparatus has a carrier plate that can be placed onto the wiring matrices and in which a plurality of contact elements are arranged, whereby respectively at least two selected measuring points of a wiring matrix can be contacted via the allocated contact elements.

In automatic testing units and test adapters for unequipped and equipped printed circuit boards as well as for wiring matrices using solder or crimp technology, the contacting of the selected measuring locations is usually undertaken via resilient test probes. The resilient test probes arranged according to a dimensioned grid of a wiring matrix to be tested are secured with spring sleeves that are pressed into a carrier plate and into which the test probes are inserted (Elektronik Produktion and Preuftechnik, November 1979, pages 472 and 473).

Given the use of resilient test probes as contact elements, increasing difficulties arise in view of the decreasing grid dimension and increasing area of the printed circuit boards. Thus, an arrangement of the resilient test probes in grid dimensions below one millimeter can hardly be achieved in terms of precision mechanical structure to give a reliable contacting of the measuring locations. The number of required leads and switch elements also increases with the plurality of measuring locations that, for example, can amount to a hundred thousand, thereby requiring a considerable apparatus-oriented outlay and correspondingly high costs.

EP-A-0 102 565 discloses an apparatus for electrical function testing of wiring matrices wherein the hitherto standard, ohmic contacting of the measuring locations, is replaced by a non-touching, ionic contacting via gas discharge paths. To this end, a plurality of gas discharge channels provided with electrodes are introduced into the carrier plate that can be placed onto the wiring matrices. The gas discharge channels, arranged in the grid of the wiring matrices, are open toward the measuring locations. When two, selected measuring locations are connected to one another in electrically conductive fashion by, for example, an interconnect, then the allocated gas discharge channels form two gas discharge paths connected in series that can be ignited by applying an adequately high voltage to the electrodes. A current flow that can be analyzed for testing purposes then occurs with the ignition of the gas discharges. When the ignition of the gas discharges does not occur or when too low a current flows after an ignition, then conclusions regarding an interrupt, electrically conductive connection or regarding an electrically conductive connection that did not exist from the very beginning between the selected measuring locations can be determined. When an alternating voltage is superimposed on the voltage applied to the electrodes, then the current change resulting therefrom can be measured phase-sensitive relative to the applied alternating voltage and can be utilized for identifying the resistance of a connection existing between the selected measuring locations.

The known apparatus thus enables conductivity and insulation measurements, whereby an extremely high reliability is achieved by avoiding ohmic contacts. In particular, wiring matrices having small grid dimensions of the measuring locations down to 0.1 mm can then be reliably tested by the principle of ionic contacting of the measuring locations via gas discharge channels realizable in extremely small dimensions. Given the great number of measuring locations in a wiring matrix to be tested, however, those same problems that can be attributed to the numerous leads and switch elements for the connection of the electrodes of the gas discharge channels continue to exist.

SUMMARY OF THE INVENTION

An object of the present invention in an apparatus of the type initially cited is to drastically reduce the number of required leads and switch elements.

This object is inventively achieved in that every measuring location is selectable by an allocated busbar and by an intermediate mask that prevents the contacting of non-selected measuring locations.

The invention is based on the fact that the connection of a plurality of contact elements can be undertaken via common busbars given the precondition that an intermediate mask is required as an additional condition. This intermediate mask only allows the contacting of selected measuring locations and prevents the contacting of non-selected measuring locations. An unambiguous addressing of selected measuring locations can thus be achieved in that the allocated busbars are selected and in that the utilized intermediate mask only allows a contacting of the selected measuring locations.

The number of leads can be considerably reduced with the inventive addressing of the selected measuring locations, particularly since the busbars can also have a greater plurality of contact elements allocated to them. In addition to a considerable reduction in the wiring outlay, the technical feasibility of the apparatus for the electrical function testing of printed circuit boards having large printed circuit board formats and small grid dimensions, in particular, is significantly facilitated and, thus, a decisive reduction in manufacturing costs is also affected. The additional outlay for a set of intermediate masks allocated to printed circuit boards can be considered slight in comparison to these advantages, particularly since manufacture and manipulation of the intermediate masks raise no significant problems.

An especially simple manipulation of the intermediate masks in the electrical function tests results when the respective intermediate mask is located between the carrier plate and the wiring matrix to be tested.

According to a further, preferred development of the invention, it is provided that holes allocated to the respectively selected measuring locations are introduced into the intermediate mask. An especially simple manufacture of the intermediate masks thereby derives.

According to an especially preferred development of the invention, the measuring locations are allocated in rows to parallel aligned busbars. Such a combination of the contact elements in rows is particularly adapted to a regular grid arrangement of the measuring locations as is usually present, for example, in printed circuit boards. A clear and especially simple positioning of the busbars then derives.

Further, it is especially advantageous for the busbars to be oriented obliquely, preferably at an angle of 45° relative to the principal directions of the wiring matrices to be tested. This measure takes account of the fact that two selected measuring locations cannot have the same busbar allocated to them. When, for example, the busbars proceed at an angle of 45° relative to the principal directions of the wiring, then, by turning the entire carrier plate by an angle of 90° or 270° relative to the wiring, all measuring locations can be reliably covered.

The contact elements can be formed by resilient test probes. Given application of this conventional technique, it is then especially advantageous when the busbars and the allocated, resilient test probes are fashioned of one piece. Such busbars having integrated test probes can then be manufactured in an especially simple way with etching technology or can be manufactured by some other parallel shaping method such as, for example, punching. The possibility of spring deflection is then preferably realized in that the test probes have U-shaped, V-shaped or Ω-shaped spring regions.

According to an especially preferred development of the invention, the contact elements are formed by gas discharge channels provided wtih electrodes. In this case, the advantages of the inventive addressing are then united with the advantages of the ionic contacting. In particular, wiring matrices having small grid dimensions of the measuring locations down to 0.1 mm can then be reliably tested.

Given the employment of gas discharge channels provided with electrodes, it is then particularly beneficial for the electrodes to be formed by sections of the busbars that cross the gas discharge channels. An application of separate electrodes can then be eliminated in this case.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 1:
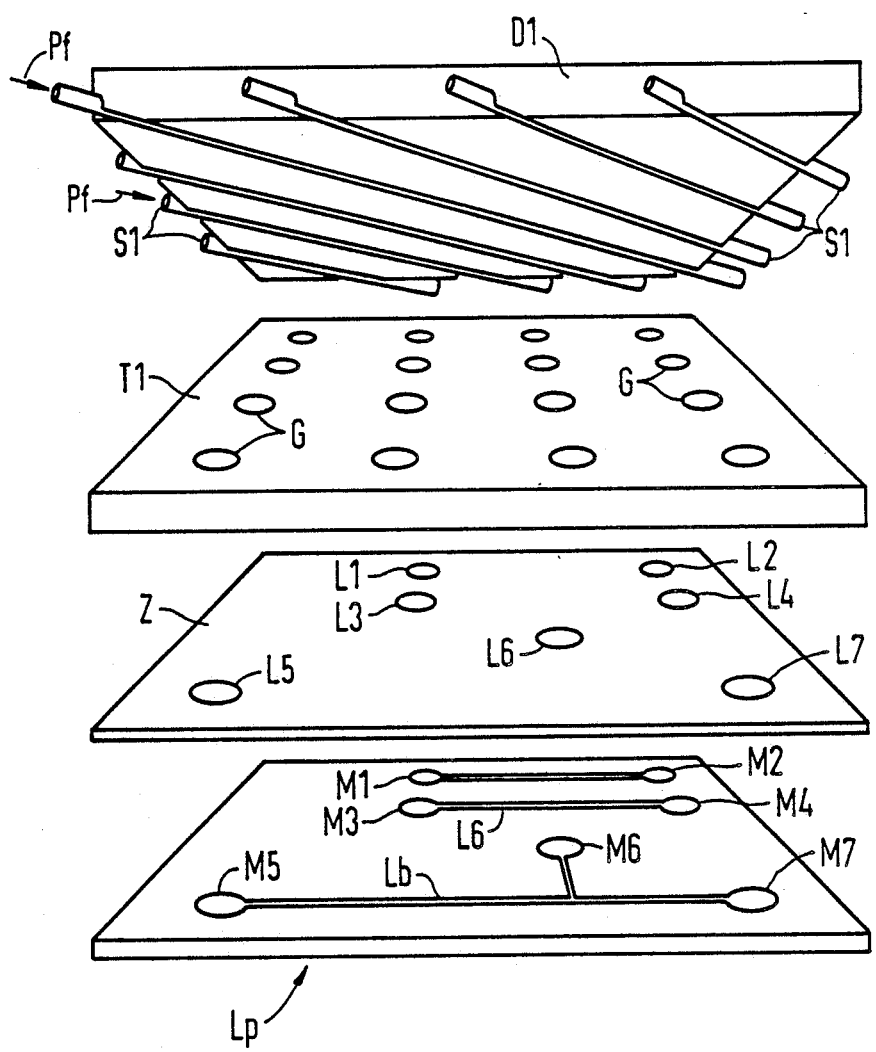
FIG. 1 is a perspective view of the apparatus illustrating the fundamental principle of the addressing with an intermediate mask and busbars and provided with gas discharge channels for the electrical function testing of printed circuit boards.
Figure 2:
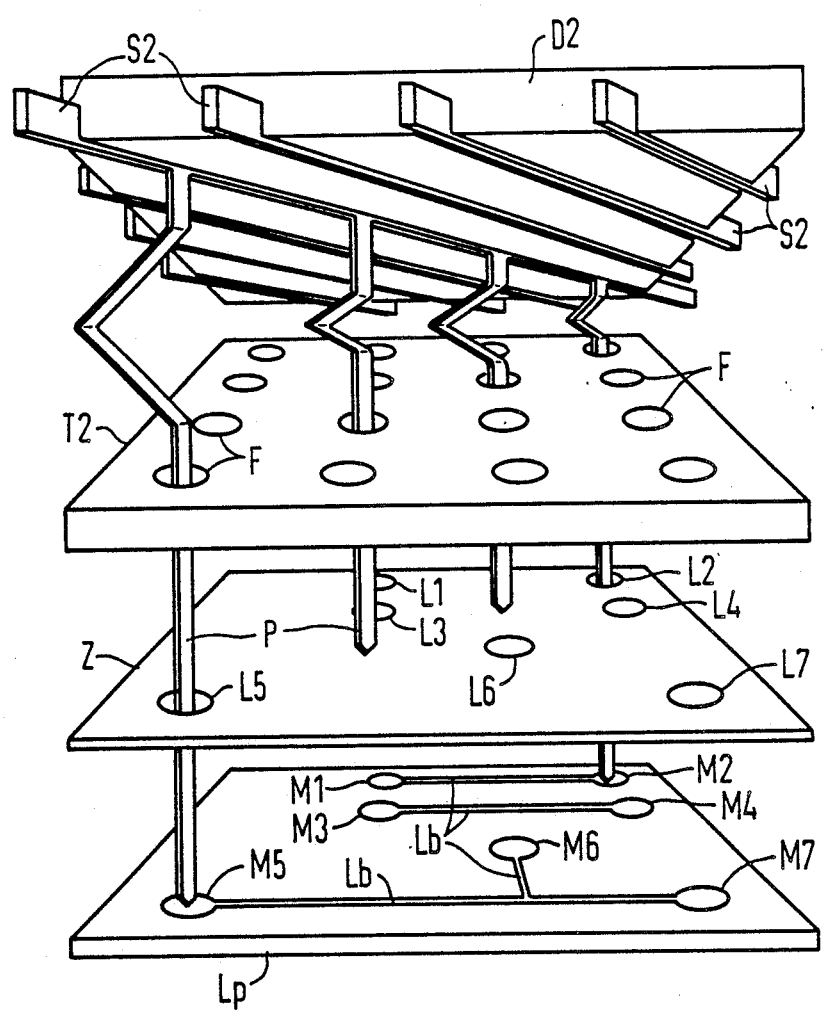
FIG. 2 is a perspective view of the apparatus illustrating the fundamental principle of addressing with an intermediate mask and busbars and provided with resilient test probes for the electrical function testing of printed circuit boards.

The apparatus shown in FIGS. 1 and 2 are used for electrical function testing of a printed circuit board Lp shown greatly simplified on whose surface respective terminal areas or, respectively, measuring locations M1 and M2, M3 and M4 as well as M5 and M7 are connected to one another by horizontally proceeding interconnects Lb. A further, vertically proceeding interconnect Lb that ends at a measuring location M6 branches off from the interconnect Lb proceeding between the measuring locations M5 and M7.

Given the apparatus shown in FIGS. 1 and 2, the inventive addressing of the measuring locations M1 through M7 occurs with the assistance of an intermediate mask Z in which holes L1 through L7 aligned with the measuring locations M1 through M7 are introduced. As set forth in greater detail below, the intermediate masks Z provided with changing hole configurations in both apparatus have the function of preventing the contacting of non-selected measuring locations and of only allowing the contacting of selected measuring locations.

Given the apparatus shown in FIG. 1, a carrier plate T1 of an insulating material may be seen in the exploded view, gas discharge channels G being introduced thereinto corresponding to the grid dimension of the printed circuit board Lp. A cover plate D1 likewise composed of insulating material is situated above this carrier plate T1, busbars S1 being partially let into or, respectively, plugged into the underside of this cover plate D1. These busbars S1 aligned parallel to one another are orientated at an angle of 45° relative to the horizontal direction of the interconnects Lb such that they respectively cross diagonal rows of the gas discharge channels G. The electrodes of the gas discharge channels G are thereby formed by those sections of the busbars S1 crossing the gas discharge channels G.

When, for example, the electrically conductive connection between the measuring locations M1 and M2 is to be tested, then an intermediate mask Z into which only the holes L1 and L2 are introduced is utilized. This intermediate mask Z, the carrier plate T1 and the cover plate D1 are then placed onto the printed circuit board Lp on top of one another, whereupon the double ignition voltage of a gas discharge path is applied to the two busbars S1 identified by arrows Pf. When the two measuring locations M1 and M2 are then connected to one another in electrically conductive fashion by the interconnect Lb running between them, then the allocated gas discharge channels G form two gas discharge paths connected in series that are ignited by the application of twice the ignition voltage to the electrodes or, respectively, selected busbars S1. A current flow that can be interpreted for testing purposes then occurs with the ignition of the gas discharges. When further measuring locations connected to one another in electrically conductive fashion are aligned with the two busbars S1 identified by arrows Pf, then their contacting is reliably prevented by the intermediate mask Z.

If two selected measuring locations happen to be aligned with the same busbar S1, then the unit is composed of carrier plate T1 and cover plate D1 is turned by an angle of 90° or 270° and only then is it put in place onto the intermediate mask Z and onto the printed circuit board Lp. In this rotated position, the two selected measuring locations are then aligned with two different busbars S1.

The apparatus shown in FIG. 2 reveals a carrier plate T2 in an exploded view into which guide channels F for test probes referenced P are introduced according to the grid dimension of the printed circuit board Lp. A cover plate D2 composed of insulating material is situated above this carrier plate T2, busbars referenced S2 being let into or, respectively, being plugged into the underside of this cover plate D2. These busbars S2 aligned parallel relative to one another also are orientated at an angle of 45° relative to the horizontal direction of the interconnects Lb, whereby arrangements turned by 90° or 270° relative to the printed circuit board Lp are possible as needed. The busbars S2 are a one-piece connection with all allocated test probes P, this being shown only for a single busbar S2 for the purpose of simplifying the drawing. The units composed of busbar S2 and of the allocated test probes P are produced, for example, from sheet metal by etching technology. The strip-shaped test probes P have V-shaped buckled portions V in their upper region that serve as spring regions and thus enable an elastic spring deflection.

The principle of addressing selected measuring locations with the intermediate mask Z may already be seen in FIG. 2 on the basis of the one diagonal row of test probes P. The contacting of the measuring locations M2 and M5 is enabled by the holes L2 and L5 in the intermediate mask Z, whereas all other test probes P of this row are restrained by the intermediate mask Z and elastically spring-deflect when the unit composed of carrier plate T2 and cover plate D2 is lowered onto the printed circuit board L2. The remainder of the electrical function testing is undertaken in a manner similar to that of the apparatus shown in FIG. 1, whereby an ohmic contacting with the test probes P replaces the ionic contacting with the gas discharge channels G.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. An apparatus for electrical function testing of wiring matrices, particularly of printed circuit boards, having a carrier plate that is placed over the wiring matrices and in which a plurality of contact elements are arranged, whereby at least two selected measuring locations of a wiring matrix are respectively contactable via the allocated contact elements, comprising a cover plate having a plurality of parallel spaced busbars, said cover plate located adjacent an opposite side of said carrier plate from an intermediate mask, every measuring location of the wiring matrix selectably contactable by an allocated busbar of said plurality of busbars and by said contact elements, said intermediate mask insertable between the carrier plate and the wiring matrix, that prevents the contacting of non-selected measuring locations, wherein the contact elements are formed by gas discharge channels provided with electrodes.

2. The apparatus according to claim 1, wherein the electrodes are formed by those sections of the busbars crossing over the gas discharge channels.

3. The apparatus according to claim 1, wherein the intermediate mask is arranged between the carrier plate and the wiring matrix to be tested.

4. The apparatus according to claim 1, wherein holes aligned with the respectively selected measuring locations are present in the intermediate mask.

5. The apparatus according to claim 1, wherein the measuring locations have associated busbars arranged in parallel rows.

6. The apparatus according to claim 5, wherein the busbars are orientated transversely relative to the principal directions of the wiring of the wiring matrices to be tested.

7. The apparatus according to claim 6, wherein the busbars are orientated at an angle of 45° relative to the principal directions of the wiring matrices to be tested.

8. An apparatus for electrical function testing of printed circuit boards having a plurality of measuring locations, the apparatus having a carrier plate in which a plurality of contact elements are arranged for contacting said measuring locations, comprising:
   an intermediate mask located between the printed circuit board and the carrier plate, the intermediate mask having a predetermined pattern of holes in alignment with selected measuring locations of the plurality of measuring locations thereby allowing contacting of the selected measuring locations by corresponding contact elements and preventing contacting of non-selected measuring locations by corresponding contact elements;
   a cover plate having a plurality of parallel spaced busbars, said cover plate located adjacent an opposite side of said carrier plate from the intermediate mask, an electrical connection established from a selected busbar to a selected measuring location via the corresponding contact element in the carrier plate and via the corresponding hole in the intermediate mask; and
   the contact elements being formed by gas discharge channels provided with electrodes.

9. The apparatus according to claim 8, wherein the electrodes are formed by those sections of the busbars crossing over the gas discharge channels.

10. The apparatus according to claim 8, wherein the busbars are oriented transversely relative to a principal direction of interconnects between the measuring locations on the printed circuit board.

11. The apparatus according to claim 10, wherein the busbars are oriented at an angle of approximately 45° relative to the principal direction of the interconnects.

* * * * *